United States Patent
Ko et al.

(10) Patent No.: US 11,297,714 B2
(45) Date of Patent: Apr. 5, 2022

(54) PRINTED CIRCUIT BOARD

(71) Applicant: Samsung Electro-Mechanics Co., Ltd., Suwon-si (KR)

(72) Inventors: Young-Kuk Ko, Suwon-si (KR); Yoong Oh, Suwon-si (KR); Sang-Hoon Kim, Suwon-si (KR); Gyu-Mook Kim, Suwon-si (KR); Yong-Soon Jang, Suwon-si (KR); Hea-Sung Kim, Suwon-si (KR)

(73) Assignee: Samsung Electro-Mechanics Co., Ltd., Suwon-si (KR)

(*) Notice: Subject to any disclaimer, the term of this patent is extended or adjusted under 35 U.S.C. 154(b) by 0 days.

(21) Appl. No.: 17/070,289

(22) Filed: Oct. 14, 2020

(65) Prior Publication Data

US 2021/0029825 A1 Jan. 28, 2021

Related U.S. Application Data

(63) Continuation of application No. 16/734,533, filed on Jan. 6, 2020, now Pat. No. 10,849,225.

(30) Foreign Application Priority Data

Jun. 18, 2019 (KR) .................. 10-2019-0072318

(51) Int. Cl.
*H05K 1/11* (2006.01)
*H05K 3/46* (2006.01)
*H05K 3/06* (2006.01)

(52) U.S. Cl.
CPC ............... *H05K 1/113* (2013.01); *H05K 3/06* (2013.01); *H05K 3/4682* (2013.01); *H05K 2201/0989* (2013.01)

(58) Field of Classification Search
CPC ................................................ H05K 1/11–119
See application file for complete search history.

(56) References Cited

U.S. PATENT DOCUMENTS

| 7,948,076 B2 | 5/2011 | Wang et al. | |
| 2009/0250260 A1* | 10/2009 | Kang | H05K 3/205 174/267 |
| 2012/0313240 A1 | 12/2012 | Cheng et al. | |
| 2016/0353568 A1* | 12/2016 | Lee | H01L 23/13 |
| 2018/0310417 A1* | 10/2018 | Lin | H05K 3/4007 |

FOREIGN PATENT DOCUMENTS

KR  10-2015-0136914 A  12/2015

* cited by examiner

*Primary Examiner* — Jeremy C Norris
(74) *Attorney, Agent, or Firm* — NSIP Law

(57) ABSTRACT

A printed circuit board includes a first insulating layer, an embedded pattern embedded in one surface of the first insulating layer, a pad formed on the one surface of the first insulating layer, and a post, wherein the center of a side surface of the post is in contact with the one surface of the first insulating layer.

16 Claims, 4 Drawing Sheets

PRINTED CIRCUIT BOARD

CROSS-REFERENCE TO RELATED APPLICATIONS

This application is a continuation of U.S. patent application Ser. No. 16/734,533 filed on Jan. 6, 2020, now U.S. Pat. No. 10,849,225 issued on Nov. 24, 2020, which claims the benefit under 35 USC 119(a) of Korean Patent Application No. 10-2019-0072318 filed on Jun. 18, 2019, in the Korean Intellectual Property Office, the entire disclosures of which are incorporated herein by reference for all purposes.

BACKGROUND

1. Field

The following description relates to a printed circuit board.

2. Description of Related Art

There has been an increased demand for multi-functional, small and thin cellular phones and electronic components of information technology (IT). Accordingly, printed circuit board structures having various types of microcircuits have been proposed. For example, a printed circuit board including a post is proposed to reduce a pitch of a bump.

However, a printed circuit board having a post presents a problem in forming a fine circuit between the posts included in the printed circuit board.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a printed circuit board includes a first insulating layer, an embedded pattern embedded in one surface of the first insulating layer, a pad formed on the one surface of the first insulating layer, and a post, wherein the center of a side surface of the post is in contact with the one surface of the first insulating layer.

A bottom part of the post may be embedded under the one surface of the first insulating layer and an upper part may protrude from the one surface of the first insulating layer.

The printed circuit board may further include a second insulating layer formed on the first insulating layer and including a through hole, wherein the embedded pattern and the pad are exposed through the through hole.

The printed circuit board may include pads and the embedded pattern may be arranged between the pads.

The second insulating layer may be a solder resist layer and an opening may be formed in the solder resist layer to expose the post.

The printed circuit board may include posts and the through hole may be arranged between the posts.

The post may further include an intermediate layer interposed between an upper part of the post and a lower part of the post.

A lower surface of the intermediate layer may be placed on a same plane as the one surface of the first insulating layer.

The printed circuit board may further include a bottom layer interposed between the pad and the one surface of the first insulating layer.

The bottom layer and the intermediate layer may be formed in a same layer.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
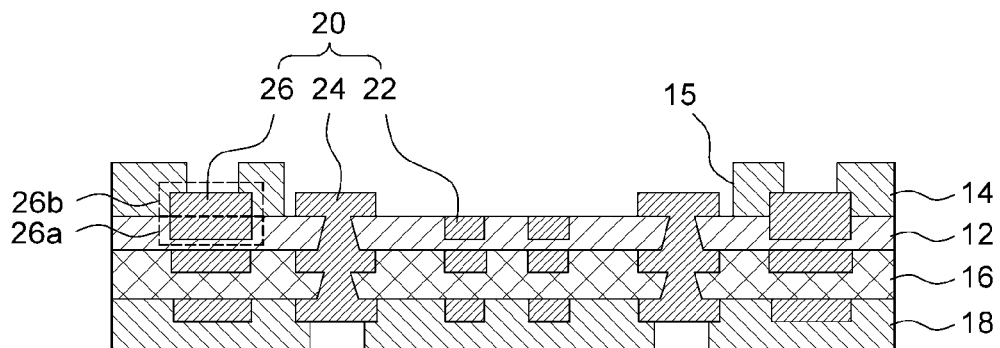
FIG. 1 is a diagram illustrating a printed circuit board according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

Herein, it is noted that use of the term "may" with respect to an example or embodiment, e.g., as to what an example or embodiment may include or implement, means that at least one example or embodiment exists where such a feature is included or implemented while all examples and embodiments are not limited thereto.

When one element is described as being "connected", "coupled" or "bonded" to another element, it shall be construed as being connected, coupled or bonded to the other element directly but also as possibly having another element in between.

Hereinafter, various examples of the printed circuit board will be described separately, but it is not excluded that the description of any one embodiment can be applied to other examples. The description of any one example may be applied to other examples as long as the relationship is compatible.

FIG. 1 is a diagram illustrating a printed circuit board according to an example.

Referring to the example of FIG. 1, a printed circuit board according to an example may include a first insulation layer 12, an embedded pattern 22, a pad 24, and a post 26.

The insulating layer 12 may electrically insulate circuit patterns 20 of the printed circuit board. For example, the first insulating layer 12 may be made of a resin material. The first insulating layer 12 may include a thermosetting resin such as an epoxy resin or a thermoplastic resin such as polyimide (PI), and may be formed of a prepreg (PPG) or a build-up film.

Referring to the example of FIG. 1, insulating layers 14, 16, and 18 other than the first insulating layer 12 may be laminated to form a multilayer structure. The circuit patterns 20 may be formed, accordingly, on each surface of the insulating layers 14, 16, and 18.

The embedded pattern 22 may be embedded in one surface of the first insulating layer 12 as a part of the circuit patterns 20 formed on the first insulating layer 12.

The circuit pattern 20 may be formed of a metal, such as copper, to which an electrical signal is able to be transmitted. However, copper is only an example, and other metals may be used in other examples. The circuit pattern 20 may be formed on one surface, the other surface, or inside of each insulating layer. For example, the circuit pattern 20 may include a via connecting both surfaces of the first insulating layer 12 by passing through the first insulating layer 12, and a pad 24 formed on one surface of the first insulating layer 12 and connected to the via.

One surface of the embedded pattern 22 may be only exposed by being embedded in the first insulating layer 12. For example, the embedded pattern 22 may have a circuit structure of an embedded trace substrate (ETS), in which a fine circuit is embedded in the substrate.

Referring to the example of FIG. 1, an upper surface of the embedded pattern 22 may be substantially flush with one surface of the first insulating layer 12 and also be exposed through the one surface of the first insulating layer 12.

The pad 24 may be formed on one surface of the first insulating layer 12 as a part of the circuit patterns 20 formed on/in the first insulating layer 12. Accordingly, the pad 24 may be disposed on one surface of the first insulating layer 12 with a protruding structure. The pad 24 may be connected to an electronic component or another pad of another substrate.

Referring to the example of FIG. 1, a lower surface of the pad 24 may be substantially flush with one surface of the first insulating layer 12, and a via passing through the first insulating layer 12 may be connected to the lower surface of the pad 24.

A second insulating layer 14 having a through hole 15 may be formed on the first insulating layer 12 and the pad 24, and the embedded pattern 22 in the first insulating layer 12 may be exposed through the through hole 15 of the first insulating layer 12.

More than one pad 24 may be formed, and the embedded pattern 22 may be disposed between the pads 24. The embedded pattern 22 formed to be less in height than the pad 24 may thus be disposed between the protruding pads 24.

The post 26 is a part of the circuit patterns 20 formed on/in the first insulating layer 12. A part of the post 26 may be embedded in the first insulating layer 12, and the other part may protrude from the first insulating layer 12. That is, the center of the side surface of the post 26 may be in contact with one surface of the first insulating layer 12.

Referring to the example of FIG. 1, a lower part 26a of the post 26 may be embedded under one surface of the first insulating layer 12, and an upper part 26b may protrude from the one surface of the first insulating layer 12. In this example, an upper surface of the protruded upper part 26b of the post 26 may be substantially flush with an upper surface of the pad 24.

The second insulating layer 14 may be a solder resist layer. In the example of FIG. 1, the post 26 may be exposed through an opening formed in the solder resist layer.

More than one post 26 may be formed and the through hole 15 may be disposed between the posts 26. Accordingly, the pad 24 and the embedded pattern 22 may be disposed between the posts 26. That is, microcircuits such as ETS-type embedded patterns 22 may be formed between the posts 26.

FIG. 3 to FIG. 7 are diagrams illustrating a method for manufacturing a printed circuit board according to an example.

Figure 3:
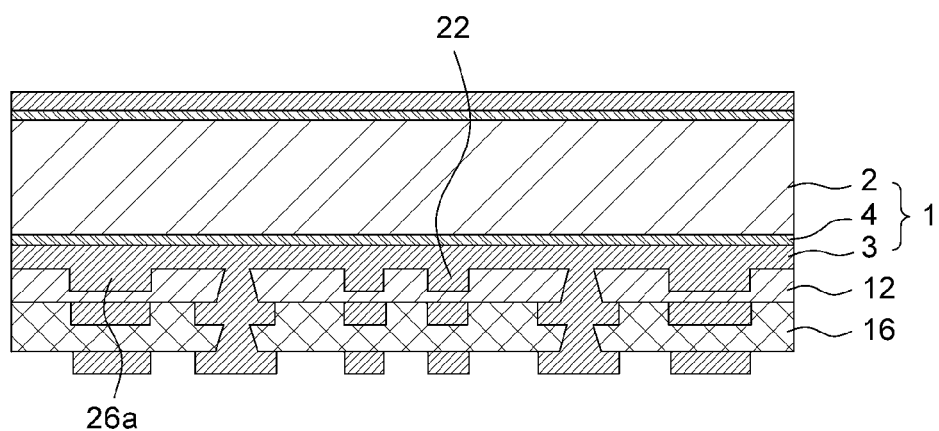
FIG. 3 to FIG. 7 are diagrams illustrating a method for manufacturing a printed circuit board according to an example.

Referring to the example of FIG. 3, a circuit pattern 20 may be formed on one surface of a first insulating layer 12. The circuit pattern 20 may also be formed on the other surface or inside of the first insulating layer 12. The circuit pattern 20 may include an embedded pattern 22. Such an embedded pattern 22 may have a circuit structure of an embedded trace substrate, in which a fine circuit is embedded in the substrate.

In the example of FIG. 3, a copper foil 3 may be formed on an outer layer of a carrier substrate 1 having an insulating material 2 and a release layer 4. The first insulating layer 12 and the circuit pattern 20 may be formed on the copper foil 3, in such an example. For example, the embedded pattern 22 and a lower part 26a of the post 26 may be formed on the copper foil 3.

In particular, in such an example, a plating layer may be formed on the copper foil 3 and a patterning process may be performed by selective etching. The circuit pattern 20 may be formed by applying a conductive metal material onto the release layer 4 of the carrier substrate 1, and then performing a patterning process or the like. The patterning process may be a tenting process, a modified semi-additive process (MSAP) process, a semi-additive process (SAP) process, or another appropriate, similar patterning process.

After the circuit pattern 20 is formed on the carrier substrate 1, the first insulating layer 12 may be pressed and laminated onto the carrier substrate 1 to embed the circuit pattern 20 in the first insulating layer 12. For example, the first insulating layer 12 may be a semi-cured prepreg. Alternatively, the first insulating layer 12, in which the circuit pattern 20 is embedded, may be formed by applying an insulating resin onto the carrier substrate 1. The circuit pattern 20, such as a via, may be additionally formed in the first insulating layer 12 laminated on the carrier substrate 1. Furthermore, another insulating layer 16 may be laminated onto the first insulating layer 12 and another circuit pattern 20 may be further formed thereon.

Figure 4:
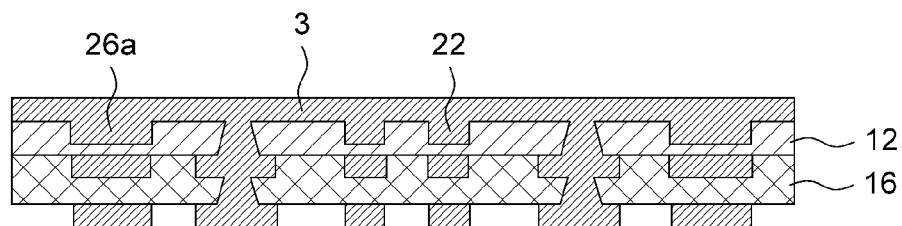

Referring to the example of FIG. 4, the first insulating layer 12, on which the circuit pattern 20 including the embedded pattern 22 and the lower part 26a of the post 26 are formed, may be separated from the carrier substrate 1. At this time, the copper foil 3 may be separated from the carrier substrate 1 by the release layer 4, so that the copper foil 3 may be bonded to one surface of the first insulation layer 12.

The embedded pattern 22 and the lower part 26a of the post 26 may be embedded in the first insulating layer 12, and may be bonded to the copper foil 3 formed on one surface of the first insulating layer 12.

Figure 5:
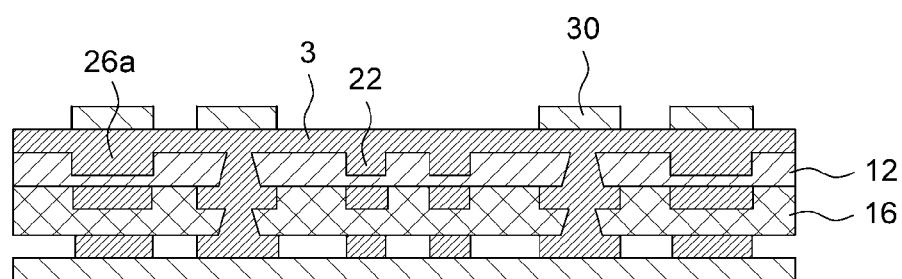

Referring to the example of FIG. 5, an etching resist 30, selectively exposing the area where the circuit pattern 20 is to be formed by the copper foil 3, may be formed. For example, the etching resist 30 may be formed on the part of the copper foil 3 where the pad 24 and the upper part 26b of the post 26 are to be formed.

The etching resist 30 may cover the already formed circuit patterns 20 in order to protect the circuit patterns 20 formed on the other surface of the first insulating layer 12 or another insulating layer 16.

Figure 6:
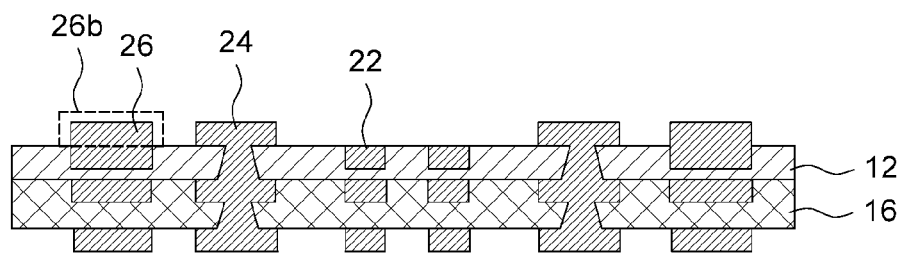
Figure 7:
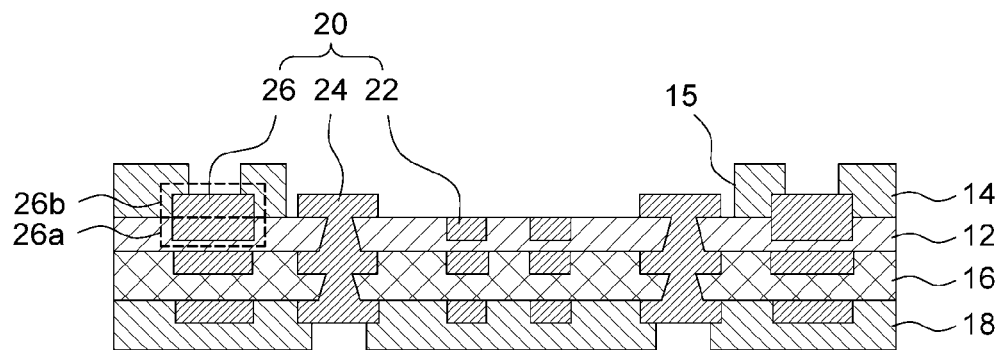

Referring to the example of FIG. 6, the circuit pattern 20 protruding from one surface of the first insulating layer 12 may be formed by patterning the copper foil 3 through etching. For example, the copper foil 3 may be etched to form the pad 24 and the upper part 26b of the post 26 on the first insulating layer 12. However, this is only one example of etching, and other appropriate etching may be performed in other examples.

In the example of FIG. 6, the post 26 may be formed to have a thickness in which the lower part 26a embedded in the first insulating layer 12 and the upper part 26b on the first insulating layer 12 are combined together. That is, a thickness of the post 26 may be the sum total of a thickness of the embedded pattern 22 and a thickness of the copper foil 3.

After the copper foil 3 is etched, the etching resist 30 may be removed, as the etching resist 30 is not needed, in that the etching resist 30 was present to aid in the etching process.

Figure 2:
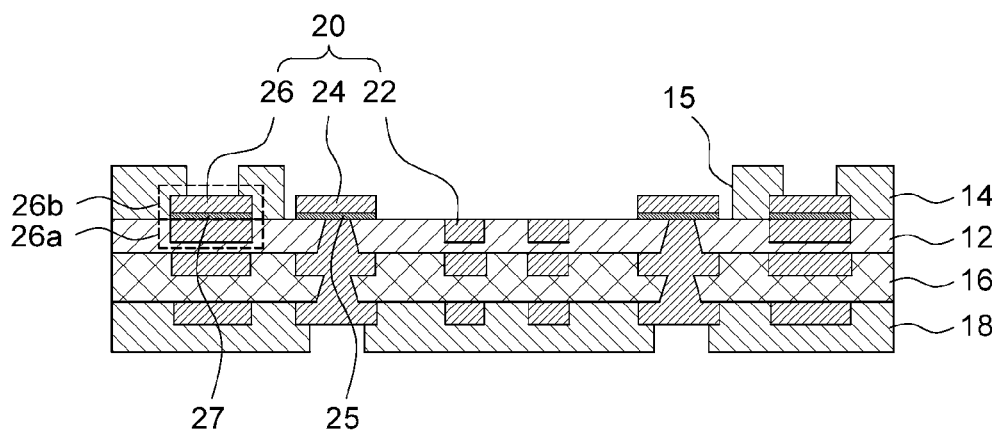
FIG. 2 is a diagram illustrating a printed circuit board according to an example.

FIG. 2 is a diagram illustrating a printed circuit board according to another example.

Figure 9:
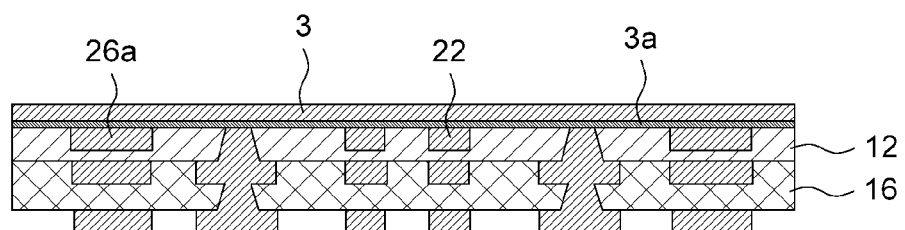

Referring to the example of FIG. 2, a printed circuit board according to this example is characterized in that a metal layer 3a, as shown in FIG. 9, is formed on the first insulating layer 12. Accordingly, this metal layer 3a is disposed at an intermediate part of the post 26 and/or on a lower surface of the pad 24.

The post 26 may further include an intermediate layer 27 interposed between an upper part 26b and a lower part 26a of the post 26. For example, the intermediate layer 27 may be formed by a part of the metal layer 3a, as shown in FIG. 9, formed to cover the embedded pattern 22 which remains in the process of manufacturing a printed circuit board.

The metal layer 3a may be made of a different material from the material used for the circuit pattern 20. For example, the metal layer 3a made of the material different from the circuit pattern 20 may protect the embedded pattern 22 without being damaged in the process related to the patterning of the circuit pattern 20. Most of the metal layer 3a may be removed during the process of manufacturing the printed circuit board. However, a part of the metal layer 3a may remain between the upper part 26b and the lower part 26a of the post 26.

For example, the intermediate layer 27 may be formed of a plating layer. As an example metal, the intermediate layer 27 may use nickel plating, but this only one example, and other metals besides nickel may be used in other examples. Because the nickel plating layer has a corrosion resistance to the substance that is used for etching the copper circuit pattern 20, it is possible to prevent the circuit pattern 20 covered by the nickel plating layer from being damaged during the process of forming the circuit patterns 20.

In addition, because the embedded pattern 22 is resistant to damage from laser and physical processing, it is also possible to effectively prevent the embedded pattern 22 from being damaged in the process of processing various substrates by proceeding as discussed, above.

In particular, because the fine circuit pattern 20 of the embedded trace structure has a very small thickness and width, the fine circuit pattern 20 may be significantly damaged by a small error in etching or processing. Therefore, when the circuit pattern 20 is covered with the metal layer 3a, chosen to be excellent in corrosion resistance and mechanical abrasion resistance, such as a nickel plating layer, the reliability and efficiency of manufacturing the printed circuit board may be improved. Such reliability and efficiency result from the protective effects of the metal layer 3a, discussed above.

Referring to the example of FIG. 2, a lower surface of the intermediate layer 27 may be disposed on the same plane as one surface of the first insulating layer 12. In such an example, the metal layer 3a may be formed on one surface of the first insulating layer 12 so that the intermediate layer 27 formed as a part of the metal layer 3a may be in contact with one surface of the first insulating layer 12.

The printed circuit board may further include a bottom layer 25 interposed between one surface of the first insulating layer 12 and the pad 24. In the example of FIG. 2, a part of the metal layer 3a may be retained between the pad 24 and one surface of the first insulating layer 12 to become the bottom layer 25.

Referring to the example of FIG. 2, the bottom layer 25 and the intermediate layer 27 may be formed to be in the same layer. The bottom layer 25 and the intermediate layer 27 may be located in the same layer, because the bottom layer 25 and the intermediate layer 27 are formed by remaining as parts of the metal layer 3a.

FIG. 8 to FIG. 11 are diagrams illustrating a method for manufacturing a printed circuit board according to an example.

Figure 8:
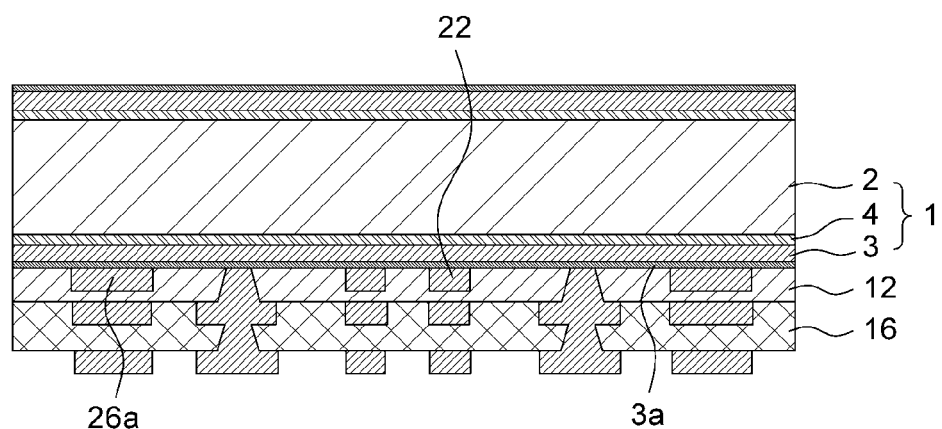
FIG. 8 to FIG. 11 are diagrams illustrating a method for manufacturing a printed circuit board according to an example.

Referring to the example of FIG. 8, a metal layer 3a may additionally be formed on a copper foil 3 of a carrier substrate 1, so that the metal layer 3a becomes the outermost layer, unlike the above-described method of manufacturing the printed circuit board. Thus, a structure in which the metal layer 3a is laminated onto one surface of the first insulating layer 12 may be formed, and an embedded pattern 22 and a lower part 26a of a post 26 may be bonded with the metal layer 3a, as well.

Referring to the example of FIG. 9, when the first insulating layer 12 on which the circuit pattern 20 is formed is separated from the carrier substrate 1, the metal layer 3a and the copper foil 3 may be laminated onto one surface of the first insulating layer 12, in order.

Figure 10:
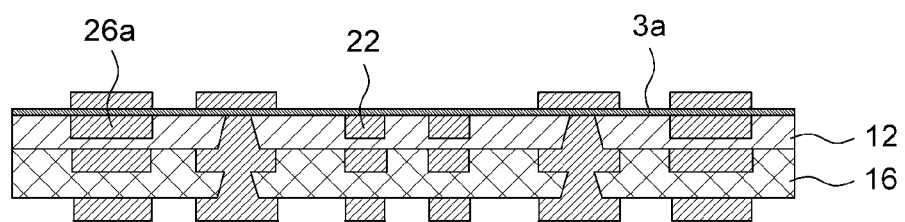

Referring to the example of FIG. 10, the circuit pattern 20 protruding from the metal layer 3a may be formed by patterning the copper foil 3 by etching. For example, the copper foil 3 may be etched to form the pad 24 and an upper part 26b of the post 26 on the metal layer 3a. The metal layer 3a made of a material different from the circuit pattern 20 may protect the embedded pattern 22 from being damaged in the etching process of the copper foil 3. Various aspects of this approach have been discussed, further, above, and will be discussed, further, below.

Figure 11:
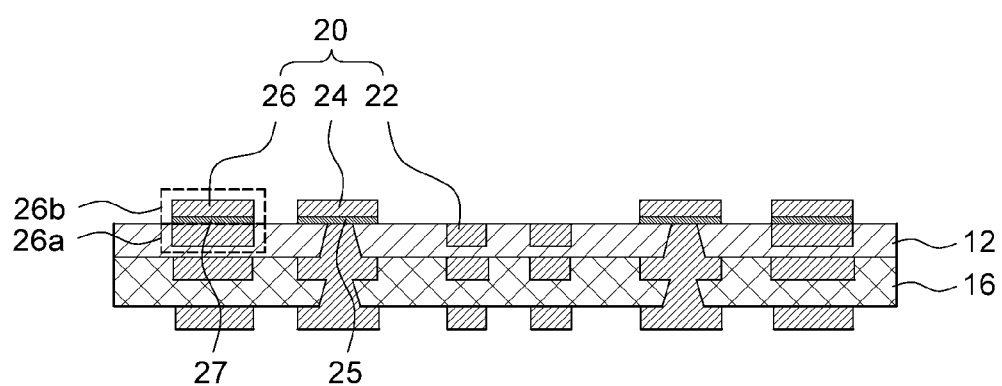

Referring to the example of FIG. 11, the metal layer 3a exposed by etching the metal layer 3a may be removed from one surface of the first insulating layer 12. In such an example, a part of the metal layer 3a may be disposed in the middle part of the post 26 and/or a lower surface of the pad 24. It is possible to prevent the embedded pattern 22 and the pad 24 from being damaged during this process by using a material that does not etch copper as an etching solution used for etching the metal layer 3a. If an etching solution of this type is used, it will obtain potentially results in that etching can occur, but the copper still acts as a protective layer.

Here, a thickness of the post 26 may be the sum of a thickness of the lower part 26a of the post embedded in the first insulating layer 12, a thickness of the intermediate layer 27, and a thickness of the upper part 26b of the post which is on the first insulating layer 12. That is, a thickness of the post 26 may be the sum total of a thickness of the embedded pattern 22, a thickness of the metal layer 3a and a thickness of the copper foil 3.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board comprising:
   a first insulating layer; and
   a post comprising a lower part embedded in one surface of first insulating layer, an upper part disposed on the one surface of the first insulating layer, and an intermediate layer interposed between the upper part of the post and the lower part of the post,
   wherein the intermediate layer comprises nickel (Ni).

2. The printed circuit board of claim 1, further comprising an embedded pattern embedded in the one surface of the first insulating layer; and
   a pad disposed on the one surface of the first insulating layer.

3. The printed circuit board of claim 2, further comprising a second insulating layer formed on the first insulating layer and comprising a through hole,
   wherein the embedded pattern and the pad are exposed through the through hole.

4. The printed circuit board of claim 3, wherein the printed circuit board comprises pads and wherein the embedded pattern is arranged between the pads.

5. The printed circuit board of claim 3, wherein the second insulating layer is a solder resist layer and an opening is formed in the solder resist layer to expose the post.

6. The printed circuit board of claim 3, wherein the printed circuit board comprises posts and the through hole is arranged between the posts.

7. The printed circuit board of claim 2, wherein the pad and the upper part of the post are disposed on a same layer.

8. The printed circuit board of claim 2, wherein the embedded pattern and the lower part of the post are disposed on a same layer.

9. The printed circuit board of claim 1, wherein the lower part of the post is embedded under the one surface of the first insulating layer and the upper part of the post protrudes from the one surface of the first insulating layer.

10. The printed circuit board of claim 1, wherein the intermediate layer is disposed on the first insulating layer.

11. The printed circuit board of claim 1, wherein one surface of the intermediate layer contacting the one surface of the first insulating layer is placed on a same plane as the one surface of the first insulating layer.

12. The printed circuit board of claim 1, further comprising a pad disposed on the one surface of the first insulating layer; and
   a bottom layer interposed between the pad and the one surface of the first insulating layer.

13. The printed circuit board of claim 12, wherein the bottom layer and the intermediate layer are disposed on a same layer.

14. The printed circuit board of claim 1, wherein the lower part of the post and the upper part of the post are in contact with the intermediate layer.

15. The printed circuit board of claim 1, wherein the lower part of the post and the upper part of the post overlap with each other.

16. The printed circuit board of claim 1, wherein the upper part of the post comprises copper (Cu).

\* \* \* \* \*